(12) United States Patent
Mun et al.

(10) Patent No.: US 12,717,066 B2
(45) Date of Patent: Aug. 25, 2026

(54) UV-BLOCKING FILM FOR ARCHITECTURAL AND AUTOMOTIVE WITH 100% UV AND BLUE LIGHT BLOCKING

(71) Applicant: M-GLASS Inc., Jeju-si (KR)

(72) Inventors: Jung Hwan Mun, Jeju-si (KR); Hyung Taek Kim, Seoul (KR)

(73) Assignee: M-GLASS Inc., Jeju-si (KR)

( * ) Notice: Subject to any disclaimer, the term of this patent is extended or adjusted under 35 U.S.C. 154(b) by 187 days.

(21) Appl. No.: 18/381,212

(22) Filed: Oct. 18, 2023

(65) Prior Publication Data

US 2025/0123423 A1 Apr. 17, 2025

(30) Foreign Application Priority Data

Oct. 17, 2023 (KR) ........................ 10-2023-0138642

(51) Int. Cl.

*G02B 1/111* (2015.01)
*C23C 14/08* (2006.01)
*G02B 1/14* (2015.01)

(52) U.S. Cl.

CPC .............. *G02B 1/111* (2013.01); *C23C 14/08* (2013.01); *G02B 1/14* (2015.01)

(58) Field of Classification Search

CPC .......... G02B 1/111; G02B 1/14; G02B 5/208; G02B 5/283; G02B 5/223; C23C 14/08; C23C 14/083; C23C 14/086; C23C 14/10; C23C 14/3464; C03C 17/002; C03C 17/3417; C03C 2217/70; C03C 2218/156; C08J 7/042

See application file for complete search history.

(56) References Cited

U.S. PATENT DOCUMENTS 7,964,285 B2 * 6/2011 Hartig ................. C03C 17/3639 428/428
2003/0124445 A1 * 7/2003 Sugimura ............ G03G 15/751 399/10
2012/0229893 A1 * 9/2012 Hebrink ................. G02B 5/283 359/359
2016/0195651 A1 * 7/2016 Yoshioka .................. B32B 7/00 359/359
2018/0210240 A1 * 7/2018 Branda ..................... G02F 1/03
2022/0173165 A1 * 6/2022 Ito ........................ H10K 85/656
2022/0173263 A1 * 6/2022 Arai ........................ H10F 19/37

(Continued)

FOREIGN PATENT DOCUMENTS

KR 10-2023-0063409 A 5/2023

OTHER PUBLICATIONS

Zeng et al, Translation of CN101216611A, Jul. 9, 2008 (Year: 2008).*

*Primary Examiner* — Dmitriy Bolotin
(74) *Attorney, Agent, or Firm* — Revolution IP, PLLC

(57) ABSTRACT

The present invention relates to UV-blocking films for architectural and automotive use that provide 100% UV and blue light blocking. UV-blocking films according to the present invention consist of a transparent base layer and a UV-blocking layer formed on the transparent base layer using a sputtering method. The UV-blocking layer includes one or more oxides selected from a group consisting of zinc, titanium, zirconium, cesium, and silicon, with a wavelength transmission rate of 0% or less in the range of 280-400 nm.

6 Claims, 2 Drawing Sheets

(56) References Cited

U.S. PATENT DOCUMENTS

| | | | | |
|---|---|---|---|---|
| 2023/0226806 | A1* | 7/2023 | Laubach | B32B 17/10174 428/1.62 |
| 2024/0066838 | A1* | 2/2024 | Teshima | B32B 17/10981 |
| 2025/0123423 | A1* | 4/2025 | Mun | G02B 5/223 |

* cited by examiner

UV-BLOCKING FILM FOR ARCHITECTURAL AND AUTOMOTIVE WITH 100% UV AND BLUE LIGHT BLOCKING

BACKGROUND OF THE INVENTION

1. Field of the Invention

The present invention pertains to UV-blocking films designed for architectural and automotive applications, capable of blocking 100% of ultraviolet rays and blue light.

2. Description of the Prior Art

Sunlight is broadly divided into ultraviolet UV (100-380 nm), visible (380-780 nm), and infrared IR (780-60,000 nm) rays. Infrared rays are further categorized into near-infrared and far-infrared. Among these, ultraviolet rays make up about 6%, visible light about 46%, and infrared about 48% of sunlight. Ultraviolet rays can cause skin aging and cancer when exposed to the skin for extended periods, while infrared rays contribute to increased indoor temperatures, leading to higher cooling costs in the summer.

UV-blocking films, made from advanced materials such as metals or ceramics that have the ability to control the amount of energy from sunlight entering enclosed spaces through glass, are used to address these issues.

These UV-blocking films are essential for windows in cars, residential, and commercial buildings. They block solar heat, creating a more comfortable driving, living, and working environment.

In particular, for vehicles, which are directly exposed to solar heat during driving and can be affected even when parked outdoors for extended periods, the installation of ultraviolet blocking films is essential.

Commonly referred to as "window tinting" for vehicles, these ultraviolet blocking films play a crucial role in protecting people and objects inside from the harmful effects of solar radiation.

In particular, it plays a role in blocking UV rays to prevent glare, protecting against eye diseases such as cataracts, glaucoma, macular degeneration, and other eye damage caused by UV exposure. It also prevents skin aging and skin damage, including skin cancer, by blocking UV exposure. Additionally, it helps prevent the generation of stress hormones (cortisol) in the skin due to UV exposure, which can help prevent a decrease in memory and cognitive function. Furthermore, it serves to protect interior components, such as those in vehicles, from discoloration, deformation, and shields against potential injuries resulting from glass breakage.

Within the visible light spectrum, there is a range of wavelengths from 380 to 495 nm called blue light. Blue light is a subset of visible light with high energy. Particularly, the violet-blue wavelength range of 380-420 nm is of concern as it can reach the retina without being absorbed by the cornea and crystalline lens, potentially damaging the retina. It is also known to be a contributing factor in issues such as visual fatigue, sleep disturbances, and more. Moreover, this blue light is known to suppress the secretion of melatonin, affecting the body's circadian rhythms.

Due to climate change, with rising average temperatures and environmental pollution leading to the destruction of the ozone layer, the adverse effects of ultraviolet, infrared, and solar radiation are becoming increasingly severe.

Recently, there has been a growing demand for products that create comfortable environments in living spaces and workspaces while promoting health. As a result, there is a growing trend in the development of technology for such functional products.

Patent Document 1: Korean Patent Application Publication No. $10^{-2023}$-0063409

SUMMARY OF THE INVENTION

The inventors aim to address the issues in the prior art by providing UV-blocking film for architectural and automotive use that may block wavelengths not only in the ultraviolet (UV) range but also in the blue-light range, specifically in the range of 380 to 420 nm.

The present invention provides UV-blocking film for architectural and automotive use, aiming to solve the issues mentioned above. The film comprises a UV-blocking layer 200 formed on a transparent base layer using a sputtering method and comprises one or more oxides selected from a group consisting of zinc, titanium, zirconium, cesium, and silicon. The film has a light transmission rate of 5% or less in the wavelength range of 100 to 420 nm.

In the present invention, the UV-blocking layer 200 may be formed with repeating layers of titanium oxide and zinc oxide, forming a multilayer structure with a thickness ranging from 30 to 100 nm.

In the present invention, there may further include an overcoating layer on the UV-blocking layer 200, a functional layer on the overcoating layer, and a protective film on the functional layer.

In the present invention, the functional layer may include one or more compounds selected from a group consisting of perylene, porphyrin, coumarin, and acridine, forming a blue light-blocking layer.

In the present invention, there may further include an infrared-blocking layer on top of the transparent substrate layer.

In the present invention, the film has a thickness of at least 3 MIL.

In the present invention, the film has a light transmission rate of 0% in the wavelength range of 100 to 400 nm.

The UV-blocking films for architectural and automotive use according to the present invention have multiple layers of oxide thin films formed using a sputtering process. These films allow them to effectively block not only UV radiation but also the blue light spectrum in the range of 380-400 nm, providing complete protection.

Moreover, the UV-blocking films of the present invention may be installed on windows of residential or commercial buildings, as well as on the windows of vehicles. By blocking UV rays, they contribute to a more comfortable and pleasant environment for driving, living, and working.

Additionally, these UV-blocking films block blue light, reducing glare and enhancing visual clarity through glass windows, which, in turn, helps alleviate eye strain for the user.

Furthermore, by blocking the 300-400 nm wavelength range, which is within the visible spectrum for insects, these films prevent or reduce the entry of insects by blocking the light inside buildings or vehicles less visible to insects.

Moreover, the UV-blocking films in the present invention feature a multi-layer structure, providing excellent impact resistance and preventing splintering or shattering.

DETAILED DESCRIPTION OF THE EXEMPLARY EMBODIMENTS

Figure 1:
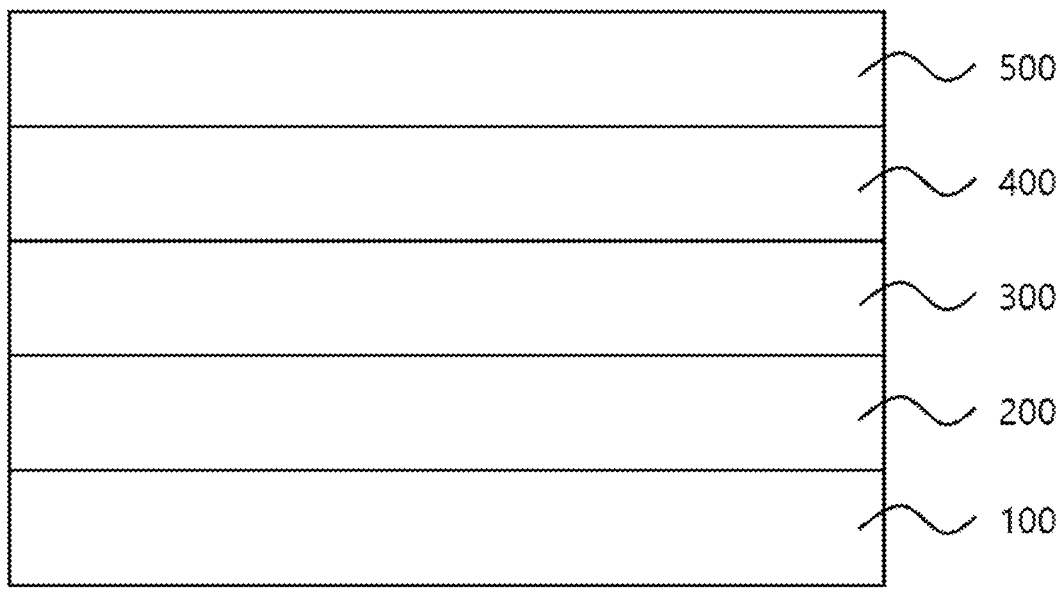
FIG. 1 is a cross-sectional view illustrating a layered structure according to an embodiment of the present invention.
Figure 2:
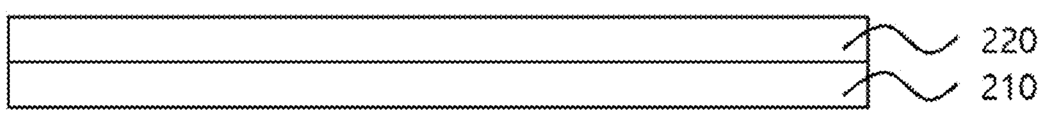
FIG. 2 is an enlarged cross-sectional view illustrating a UV-blocking layer in detail.

The following provides a detailed explanation of exemplary embodiments of the present invention with reference to attached drawings. These embodiments are presented to sufficiently convey the principles of the present invention to those skilled in the art to which the present invention belongs. The present invention is not limited to the embodiments presented herein and may be realized in other forms. Drawings may omit portions unrelated to the present invention to clarify the invention and may exaggerate the sizes of components for the purpose of clarity.

The technical terminology used in this specification is intended for reference to specific embodiments and is not intended to limit the scope of the invention. The use of singular forms here is inclusive of plural forms unless explicitly indicating otherwise. Moreover, the terms "comprise" or "include" in this context are used to specify the presence of specific features, regions, integers, steps, operations, elements, or components, and do not exclude the presence or possibility of one or more other features, regions, integers, steps, operations, elements, or components.

In this specification, terms like "first," "second," etc., are used to describe various components, and these terms are used solely for distinguishing one component from another. These terms do not intend to imply any particular order, arrangement, or importance of the components.

Furthermore, the terms used in this specification are employed merely to explain exemplary embodiments and are not intended to limit the invention. The use of the singular form is inclusive of the plural unless the context clearly indicates otherwise. In this specification, terms such as "comprising," "including," or "having" are used to specify the presence of features, numbers, steps, components, or elements, and do not preclude the presence or possibility of one or more other features, numbers, steps, components, or elements.

The present invention may take various modifications and has multiple forms, and exemplary embodiments are provided herein to describe and explain the invention in detail. However, it should be understood that the intention is not to limit the invention to specific starting forms, and it should be construed that all modifications, equivalents, and alternatives falling within the scope of the invention are included.

Hereinafter, a detailed sequential description of the UV-blocking film for architectural and automotive capable of 100% UV and blue light blocking according to the present invention is provided.

The present invention relates to UV-blocking film for architectural and automotive, more specifically, to UV-blocking film for architectural and automotive capable of 100% UV and blue light blocking.

The UV-blocking film for architectural and automotive includes a transparent base layer 100 and a UV-blocking layer 200 formed on the transparent base layer 100.

The transparent base layer 100 serves as the substrate of the UV-blocking film and may be a material with a visible light transmittance of 70% or more. The materials used for the transparent base layer 100 are not specifically limited, with this transmittance requirement.

Specifically, the transparent base layer 100 is formed from a transparent polymer resin that does not obstruct the user's field of vision, particularly a transparent UV-curable resin.

For example, the transparent base layer 100 can be manufactured from a transparent polymer resin including one or more selected from groups comprising polyester, acrylic, cellulose, polyolefin, polyvinyl chloride, polycarbonate, phenol, and urethane.

For example, the transparent polymer resins that balance heat resistance and flexibility, such as acrylic, polyester, and polycarbonate resins, are preferable, and biaxially oriented polyester and polycarbonate are more preferable.

For example, the thickness of the transparent base layer 100 is not particularly limited but may be 5 μm or more, 10 μm or more, 20 μm or more, or 30 μm or more, with an upper limit of 150 μm or 200 μm.

As a result, the UV-blocking film has a light transmission rate of 0% in the wavelength range of 100 to 420 nm.

In other words, the UV-blocking film described herein not only blocks 100% of the UV range, specifically wavelengths between 100 to 380 nm, but also has the capability to block 100% of the blue light range, especially in the violet-blue wavelength range of 380 to 400 nm within the visible light spectrum, which carries strong energy.

As a result, the UV-blocking film according to the present invention provides benefits such as blocking blue light to reduce glare from windows and enhance visual clarity, thereby reducing eye fatigue for the users. Additionally, it blocks the wavelength range of 300 to 400 nm, which is within the range of insect visibility. This feature can prevent or reduce insect ingress into buildings or vehicles by blocking light that insects may see.

The UV-blocking layer 200 is formed on the transparent substrate layer using the sputtering method and includes one or more oxides selected from the group comprising zinc Zn, titanium Ti, zirconium Zr, cesium Cs, and silicon Si.

The sputtering method is a process where sputtering gas is introduced into a chamber maintained at a vacuum, generating plasma. Subsequently, the particles within the plasma collide with the target material that is intended to be coated, and through these collisions, material separated from the target is deposited as a coating onto a substrate. Typically, the sputtering gas employed is the inert gas such as argon Ar. The sputtering system uses the target as the cathode and the substrate as the anode.

Upon applying power, the introduced sputtering gas undergoes ionization Ar+ by colliding with the electrons emitted from the cathode. These ions are then attracted to the cathodic target, resulting in collisions with the target. The energy carried by these ions is transferred to the target material, causing atoms, molecules, or other constituents of the target material to be expelled into the chamber. These expelled target materials then form a thin film on the substrate.

This technology for producing thin films using the sputtering method allows precise control of coating thickness, even down to a few micrometers μm. Furthermore, it facilitates the straightforward processing of partial coatings, especially when using a simple mask.

The UV-blocking layer 200 includes metal oxides and, specifically, it may have a multilayered structure with at least two layers forming the thin film. These metal oxides may take the form of nano-wires, nano-sheets, nano-tubes, nano-rods, or nano-flowers, for example.

The metal oxides within the UV-blocking layer 200 are formed on the transparent base layer 100 using the sputtering method, the metal oxides may include of one or more oxides chosen from a group of materials including zinc Zn, titanium Ti, zirconium Zr, cesium Cs, and silicon Si. These metal oxides may include one or more oxides selected from a group of materials such as titanium dioxide TiO2, zinc oxide ZnO, zirconium oxide ZrO, cesium oxide CsO, and silicon dioxide SiO2.

For example, the UV-blocking layer 200 may be formed of repeating layers of titanium oxide TiO2 210 and zinc oxide ZnO 220, forming a thin film with two or more layers.

For example, the UV-blocking layer 200 may have a two-layer structure where the zinc oxide layer is formed on the transparent base layer 100, the titanium dioxide layer is formed on the zinc oxide layer. Alternatively, the UV-blocking layer 200 may have a two-layer structure with the titanium dioxide layer formed on the transparent base layer 100, and the zinc oxide layer formed on the titanium dioxide layer.

For example, the UV-blocking layer 200 may have a three-layer structure where the zinc oxide layer is formed on the transparent base layer 100, the titanium dioxide layer is formed on the zinc oxide layer, and then the zinc oxide layer is formed on the titanium dioxide layer. Alternatively, the UV-blocking layer 200 may have a three-layer structure with the titanium dioxide layer formed on the transparent base layer 100, the zinc oxide layer is formed on the the titanium dioxide layer, and then the titanium dioxide layer is formed on top of the zinc oxide layer.

Furthermore, the UV-blocking layer 200 may have alternating layers of zinc oxide and titanium dioxide, forming a multilayer structure with four or five layers.

Specifically, this UV-blocking layer 200 may include nano-wires made of zinc oxide ZnO and nano-sheets made of titanium dioxide TiO2. The combination of zinc oxide nano-wires and titanium dioxide nano-sheets may form a structure where zinc oxide nano-wire layers and titanium dioxide nano-sheet layers are alternated.

The zinc oxide nano-wires and/or titanium dioxide nano-sheets are designed in structural forms that enhance their excellent light-blocking effects in the UV range. By manufacturing them in structural shapes, they may significantly increase their light-blocking effectiveness in the UV range compared to the effects achieved with powdered or granulated forms.

The thickness of the layers may have a range from 30 to 100 nanometers nm.

The UV-blocking film for architecture and automotive use may further include an overcoating layer 300 on the UV-blocking layer 200, a functional layer 400 on the overcoating layer 300, and a protective film on the functional layer 400.

The overcoating layer 300 is designed to maintain transparency to visible light and prevent damage to a light-blocking layer such as the UV-blocking layer 200 and the infrared-blocking layer. The materials for the overcoating layer 300 are not strictly limited and may include commonly used materials in the field. For example, the overcoating layer 300 may include of a composition that has monofunctional or multifunctional optical-curing organic compounds and inorganic or organic particles.

The overcoating layer 300 may have a thickness of 100 nm or less. If the thickness exceeds this range, it may reduce the transparency of the window film and diminish the infrared reflection functionality due to the infrared absorption by the overcoating layer 300.

The overcoating layer 300 may include a functional layer 400, such as a blue light blocking layer, which may consist of one or more selected from the group including perylene, porphyrin, coumarin, and acridine.

The UV-blocking film may block not only the UV range of 100-380 nm but also the blue light range, particularly in the 380-400 nm wavelength range. To enhance the stable blocking of the blue light range, an optional functional layer 400 may be included, which includes of organic materials. The UV-blocking film including the organic functional layer 400 provides a significant effect as it allows blocking of all wavelengths not blocked by the inorganic film.

The UV-blocking film may further include a protective film 500 on the functional layer 400. The protective film 500 may protect the window film from forces or environmental factors during handling, transportation, or installation. Furthermore, the protective film 500 may be removed from one side of the UV-blocking film without damaging the overcoating layer 300 during installation.

The material of the protective film 500 may include polymer films commonly known in the technical field. For example, polyester films such as polyethylene terephthalate or polybutylene terephthalate, polytetrafluoroethylene film, polyethylene film, polypropylene film, polybutene film, polybutadiene film, polyvinyl chloride film, or polyimide film, among other plastic films, may be used. The protective film 500 may be used as single layers or multiple layers. The thickness of the protective film 500 is not particularly limited but may be within the range of 10 μm to 100 μm.

The UV-blocking film for architectural and automotive may include an infrared blocking layer on the transparent base layer 100.

The UV-blocking layer 200 and the infrared blocking layer may be sequentially layered on the transparent base layer 100. For example, the UV-blocking layer 200 is formed on the transparent base layer 100, and then the infrared blocking layer is formed on the UV-blocking layer 200. Alternatively, for example, the infrared blocking layer is formed on the transparent base layer 100, and then the UV-blocking layer 200 is formed on the infrared blocking layer, formed sequentially.

In one embodiment of the present invention, the UV-blocking film for architectural and automotive may have a thickness of 3 MIL or greater.

Below, the present invention is described in more detail through examples and experimental examples.

However, these examples and experimental cases are merely illustrative, and the content of the invention is not limited to these.

Example 1

As a transparent substrate, a transparent glass plate (Corning 1747) was introduced into a dry deposition apparatus and fixed. The inside of the reaction chamber was then evacuated to a vacuum state of approximately $1\times10^{-7}$ Torr. Once the pressure conditions of the deposition apparatus were satisfied, argon 10 sccm was injected into the deposition apparatus and maintained at $1\times10^{-3}$ Torr. A plasma was formed by applying 50 W of 13.56 MHz radio frequency RF power to the sputtering gun installed inside the deposition apparatus. And then, titanium dioxide TiO2 and zinc oxide ZnO were deposited on the transparent glass plate using RF/DC sputtering to achieve average thicknesses of 25 nm and 20 nm, respectively. In this process, titanium dioxide TiO2 was deposited at a rate of 5 nm/min, and zinc oxide ZnO was deposited at a rate of 4 nm/min, thus, the ultra-violet-blocking layer was formed.

Example 2

A UV-blocking film was manufactured as in Example 1, except that titanium dioxide $TiO_2$, zinc oxide ZnO, and titanium dioxide $TiO_2$ were deposited on the transparent glass plate at average thicknesses of 25 nm, 20 nm, and 25 nm, respectively, using RF/DC sputtering.

Example 3

A UV-blocking film was manufactured as in Example 1, except that zinc oxide ZnO and titanium dioxide $TiO_2$ were deposited on the transparent glass plate at average thicknesses of 20 nm and 25 nm, respectively, using RF/DC sputtering.

Example 4

A UV-blocking film was manufactured as in Example 1, except that zinc oxide ZnO, titanium dioxide $TiO_2$, and zinc oxide ZnO were deposited on the transparent glass plate at average thicknesses of 20 nm, 25 nm, and 20 nm, respectively, using RF/DC sputtering.

Comparative Example 1

A UV-blocking film was manufactured as in Example 1, except that zinc oxide ZnO was deposited in 2 layers, each with an average thickness of 20 nm, using RF/DC sputtering.

Comparative Example 2

A UV-blocking film was manufactured as in Example 1, except that titanium dioxide $TiO_2$ was deposited in 2 layers, each with an average thickness of 25 nm, using RF/DC sputtering.

The films produced in the above examples were optically tested according to KS L 2016:2014, section 6.3. The results are presented in the table below. The testing environment was maintained at a temperature of 21-25° C. and a humidity of 60-65% R.H.

TABLE 1

| | Example 1 | Example 2 | Example 3 | Example 4 | Comparative Example 1 | Comparative Example 2 |
|---|---|---|---|---|---|---|
| Transmittance of Visible Light (TL:%) | 48.5 | 47.0 | 47.5 | 45.9 | 46.8 | 47.0 |
| Visible Light Reflectance (Ext.) | 8.5 | 9.0 | 8.7 | 9.0 | 8.8 | 9.1 |
| Visible Light Reflectance (Int.) | 9.8 | 10.3 | 10.1 | 10.2 | 9.8 | 9.5 |
| Transmittance of Ultra Violet (TUV:%) | 0 | 0 | 0 | 0 | 2.8 | 1.5 |
| Shading Coefficient (SC) | 0.53 | 0.54 | 0.52 | 0.53 | 0.51 | 0.52 |
| Transmittance of Blue Light (%) | 0 | 0 | 0 | 0 | 5.5 | 4.6 |

Here, ultraviolet rays refer to the wavelength range of 100 to 380 nm, and blue light means the wavelength range of 380 to 400 nm.

According to the examples, all UV-blocking films showed a 0% ultraviolet transmittance and blue light transmittance. In the comparative examples, the ultraviolet transmittance was over 1.5%, and the blue light transmittance was over 4.6%.

In other words, the UV-blocking films of the present invention may completely block the transmittance in the 100-400 nm wavelength range, which covers the ultraviolet and blue light regions.

The description in this specification is for illustrative purposes, and those skilled in the art to which the present disclosure pertains will understand that the technical teachings of the present disclosure can be readily modified into different specific forms without altering essential features. Therefore, the embodiments described above are exemplary in all respects and not limiting. For example, individual components described as single units can be implemented in a distributed manner, and similarly, components described as distributed can be implemented in a combined form.

The scope of the present disclosure is defined by the claims provided hereinafter rather than the detailed description above, and any modifications or variations derived from the meaning and scope of the claims and the doctrine of equivalents should be construed as included within the scope of the present disclosure.

The invention claimed is:

1. A UV-blocking film used for architectural and automotive, comprising:

a transparent base layer; and a UV-blocking layer formed on the transparent base layer using a sputtering method and comprising one or more oxides selected from a group consisting of zinc, titanium, zirconium, cesium, and silicon, with a wavelength transmission rate of 5% or less in the range of 100-420 nm, wherein the UV-blocking layer comprises two or more thin films formed by repeating layers of titanium oxide and zinc oxide, with a thickness in the range of 30-100 nm.

2. The UV-blocking film of claim 1, further comprising an overcoating layer on the UV-blocking layer;

a functional layer on the overcoating layer; and a protective film on the functional layer.

3. The UV-blocking film of claim 2, wherein the functional layer comprises a blue light-blocking layer comprising one or more selected from the group consisting of perylene, porphyrin, coumarin, and acridine.

4. The UV-blocking film of claim 1, wherein the UV-blocking film further comprises an IR-blocking layer on the transparent base layer.

5. The UV-blocking film of claim 1, wherein the film has a thickness of 3 MIL or more.

6. The UV-blocking film of claim 1, wherein the UV-blocking film has a wavelength transmission rate of 0% in the range of 100-400 nm.

* * * * *